United States Patent

Yoshimoto et al.

Patent Number: 5,340,697
Date of Patent: Aug. 23, 1994

[54] NEGATIVE TYPE PHOTORESIST COMPOSITION

[75] Inventors: Hiroshi Yoshimoto; Kazuya Uenishi; Tadayoshi Kokubo, all of Shizuoka, Japan

[73] Assignee: Fuji Photo Film Co., Ltd., Kanagawa, Japan

[21] Appl. No.: 73,564

[22] Filed: Jun. 9, 1993

[30] Foreign Application Priority Data

Jun. 9, 1992 [JP] Japan .................. 4-149392

[51] Int. Cl.$^5$ .............................. G03C 1/492
[52] U.S. Cl. .................. 430/270; 430/919; 430/920; 522/63; 522/166
[58] Field of Search ............ 430/920, 919, 270; 522/63, 166

[56] References Cited

U.S. PATENT DOCUMENTS

| | | | |
|---|---|---|---|
| 4,189,323 | 2/1980 | Buhr | 430/281 |
| 4,594,310 | 6/1986 | Nagasaka | 430/920 |
| 4,837,128 | 6/1989 | Kawamura et al. | 430/920 |
| 5,057,397 | 10/1991 | Miyabe et al. | 430/270 |
| 5,064,741 | 11/1991 | Koike et al. | 930/920 |
| 5,180,653 | 1/1993 | Miyabe et al. | 430/296 |

FOREIGN PATENT DOCUMENTS

| | | | |
|---|---|---|---|
| 0164248 | 5/1985 | European Pat. Off. | G03F 7/022 |
| 1378861 | 12/1974 | United Kingdom | G03C 1/60 |

*Primary Examiner*—Jack P. Brammer
*Attorney, Agent, or Firm*—Sughrue, Mion, Zinn, Macpeak & Seas

[57] ABSTRACT

A negative type photoresist composition comprising a light-sensitive s-triazine compound represented by formula (I), an acid-crosslinkable material, and an alkali soluble resin:

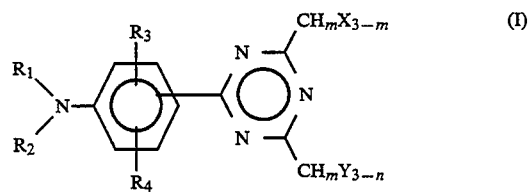

wherein $R_1$ and $R_2$, which may be the same or different, each represents a hydrogen atom, an alkyl group, a substituted alkyl group, an aryl group, a substituted aryl group, a group represented by formula (II) or (III), or $R_1$ and $R_2$ may form a heterocyclic group consisting of non-metal atoms bonded to a nitrogen atom; $R_3$ and $R_4$ each represent a hydrogen atom, a halogen atom, an alkyl group, or an alkoxy group; X and Y, which may be the same or different, each represents a chlorine atom or a bromine atom; and m and n each represents 0, 1 or 2;

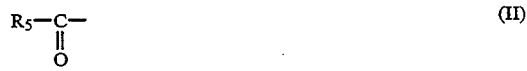

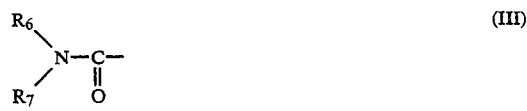

wherein $R_5$ represents an alkyl group, a substituted alkyl group, an aryl group, or a substituted aryl group; and $R_6$ and $R_7$, which may be the same or different, each represents a hydrogen atom, an alkyl group, a substituted alkyl group, an aryl group, or a substituted aryl group.

4 Claims, No Drawings

NEGATIVE TYPE PHOTORESIST COMPOSITION

FIELD OF THE INVENTION

The present invention relates to a negative type photoresist composition which comprises a specific radiation-sensitive acid generating agent, an acid-crosslinkable material, and an alkali soluble resin and which is sensitive to light such as UV, far UV, X ray, electron beam, molecular beam, γ ray, and synchrotron particles. More specifically, the present invention relates to a negative type photoresist composition which has excellent resolution and sensitivity, and is substantially free from the defects attributable to development residue.

The negative type photoresist composition according to the present invention is coated on a substrate such as a semiconductor wafer, glass, ceramic, and metal in a thickness of 0.3 to 5 μm by a spin coating method or a roller coating method. Then, the coated substrate is dried, and a circuit pattern is printed via an exposing mask by irradiation using UV rays, followed by heating the coated substrate according to necessity and then developing, whereby a negative image can be obtained. Further, etching can be carried out using this image as a mask to subject the substrate to a patternwise processing.

Typical applications include the use thereof in a manufacturing process of a semiconductor such as IC, a circuit board for a liquid crystal, and a thermal head, as well as the use thereof in other photofabrication steps. Further, since this image (and substrate) demonstrate an affinity to ink, such can be applied to a lithographic printing plate.

BACKGROUND OF THE INVENTION

High integration in processing a semi-conductor substrate is accompanied with the requirement for a photoresist having a high resolution. However, it is known that a negative type resist composition consisting of a cyclized rubber and a photocrosslinking agent such as hisazide causes swelling during development which results in deteriorating the resolution. In a negative type photoresist composition consisting of a novolak resin and a resolution controlling agent such as naphthoquinonediazide, such swelling does not take place and a high resolution can be obtained. Accordingly, at present, in the fine processing of a semiconductor, a lithography, in which a positive type resist is used, is primarily applied.

The novolak resin, used as a binder, is advantageous because it is soluble in a developing solution without swelling. Further, the novolak resin provides the advantages that it gives a high plasma etching durability to a resist and it enables the development to be carried out in an aqueous alkali. Accordingly, the novolak resin is one of the most desirable binders (these binders are a base component for the resist particularly in the application of the fine processing of a semiconductor).

In the positive type photoresist comprising naphthoquinonediazide and a novolak resin, various attempts on material design have been made in order to obtain a high resolution (resulting in the issuance of many patents and literature discussing such embodiments). For example, it has been found that a naphthoquinonediazide compound provides a dissolution controlling action on the novolak resin and is an important factor for controlling the resolution in the positive type photoresist. This is because the larger this effect is, the larger the dissolution contrast in a development process between an exposed portion and an unexposed portion can be achieved. In recent years, the essence of this dissolution controlling action has been determined to be connected to in the molecular structures of the novolak resin and sensitizer. For example, this dissolution controlling effect is discussed in connection with the molecular structure and physical properties of the novolak resin in the collection of papers from the SPIE Microlithography Symposium, vol. 920, No. 349 and vol. 1262, No. 476 and 493. In addition, many other patents and publications have discussed this connection.

In some cases, in a pattern transfer for processing, the resist used for forming a negative image, rather than a positive image, is desired. Such cases may depend on the kinds of patterns formed and masks. The resist containing a photocrosslinking agent, such as hisazide, is known as a negative type resist in which the novolak resin is used as a binder. However, this resist has the serious defect that because of a narrow latitude in development and a large photoabsorption of the photo-crosslinking agent, the cross-sectional form of the resulting resist pattern shows a reverse trapezoid.

There is available a method in which a photoacid generating agent and an additive (which causes a curing reaction to the binder to occur ( with acid as a catalyst)) are combined and added to the novolak resin to thereby obtain a negative type light-sensitive resin composition. In this method, an increase is expected in the chemical reaction yield (based on a catalytic reaction) following exposure where the addition of a sensitizer results in decreasing the amount of the photoabsorbing component.

Accordingly, it is possible to solve the above problem regarding the cross-sectional form specific to the negative type resist and, therefore, it can be expected to be promising as a resist material for fine processing. Further, because the reaction system is accompanied with an increase in the chemical reaction yield, a high quantum yield, that is, a high sensitivity, can be expected. As a result, the use of this light-sensitive composition for a light-sensitive layer for a lithography can lead to the application to a high sensitivity printing plate suitable for drawing with a laser ray.

The following background art is known for such photocurable resin composition.

That is, there is disclosed in JP-B-54-23574 (the term "JP-B", as used herein, means an examined Japanese patent publication) a technique for photocuring a novolak resin in combination with a photoacid generating agent comprising an organic halogen compound.

It is described in British Patent 1378861 that there can be applied a photoacid generating agent consisting of a diazo compound and a phenol resin such as novolak as a binder for a photocurable composition consisting of methylol melamine and others.

A similar technique is disclosed in U.S. Pat. No. 4,189,323 in which a s-triazine compound having a dinuclear or trinuclear aromatic group is used.

In European Patent 164248 a composition is disclosed comprising an acid curable amino blast resin consisting of a photoacid generating agent, a melamine resin and others, and a conventional novolak resin; and it is described that a negative image can be formed by an aqueous development which has a high heat stability.

In JP-A-62-164045 ( the term "JP-A" as used herein means an unexamined Japanese patent application), an organic halogen compound is disclosed as having photoabsorption in the far UV region which can be favorably used as a photoacid generating agent for such a composition. Similarly, European Patent 349803 describes that an organic halogen compound having a pKa value falling within a specific range is advantageous as a photoacid generating agent of a similar system.

European Patent 361907 discloses that oximesulfonic acid esters are effective as photoacid generating agents for similar photocurable compositions. Further, it is described in U.S. Pat. Nos. 5,057,397 and 5,180,653 that a composition in which a photoacid generating agent having a specific trichlorotriazine group and a novolak resin containing m-cresol of 30% or more in alkoxylated melamine are combined is advantageous for an exposure with high energy rays. Further, it is disclosed in European Patent 397460A that a novolak resin having a high branch degree is used in a similar composition.

In addition, compounds generating a free radical upon decomposition by exposure to light are well known in the field of graphic art. They are widely used as a photopolymerization initiator in a photopolymerizable composition, a photoactivator in a free radical photographic composition, and a photoinitiator in a reaction catalyzed by an acid generated by light. Such a free radical generator is used to prepare various light-sensitive materials in image-forming systems useful for printing, reproduction, copying, etc.

An organic halogen compound is subjected to photodissociation to provide a halogen free radical such as a chlorine free radical and a bromine free radical. These halogen free radicals are good hydrogen-drawing agents and the presence of a hydrogen-providing product generates an acid. The applications thereof to the photopolymerization process and free radical photographic process are described at pages 180 to 181 and 361 to 370 in "Light-Sensitive Systems" written by J. Kosar, John Wiley & Sons (New York 1965).

Carbon tetrabromide, Iodoform and tribromoacetophenone have thus far been representative as the compound generating a halogen free radical by the action of a ray and have been widely used. However, these free radical generators have the defect that they are only decomposed by a ray over a relatively limited wavelength region. That is, they are sensitive in the UV region where the wavelength is shorter than the primary wavelength of a light source commonly used. Accordingly, because of the inability to effectively utilize the rays in the near UV to visible region, these compounds have an inferior ability to generate a free radical.

In order to improve this defect, it was proposed to expand the sensitive wavelength area by adding sensitizers. Such proposed sensitizers were a merocyanine dye, a styryl base and a cyanine dye as described in, for example, U.S. Pat. Nos. 3,106,466 and 3,121,633. The light-sensitive areas of carbon tetrabromide and iodoform are expanded to the visible ray wavelength region. However, it is not yet satisfactory because while the sensitizers having a good compatibility with a free radical generator or the other elements contained in a light-sensitive composition are required to be selected, it is difficult to select those having a good compatibility and showing a high sensitivity.

In order to improve this defect, halogen free radical generators were proposed having a light-sensitive wavelength region extended over a near UV region to a visible ray region. Available are the halomethyl-s-triazine groups described in, for example, U.S. Pat. Nos. 3,954,475, 3,987,037 and 4,189,323. While these compound groups have a light-sensitive wavelength area in the near UV region to the visible ray region, an irradiated ray is not effectively used and the sensitivity for a photodissociation is comparatively low. Further, the light-sensitive compositions in which these triazine compounds are used have the defect that the triazine compound is crystallized during storage for a long period of time, which leads to a reduction in sensitivity.

SUMMARY OF THE INVENTION

Accordingly, the object of the present invention is to provide a negative type light-sensitive composition containing an acid generator having a high sensitivity to photodissociation, allows a high resolution to be obtained at a high sensitivity and scarcely generates residue upon development. Further, another object of the present invention is to provide a light-sensitive composition having an excellent storing stability. This light-sensitive composition is particularly useful as a microphotoresist for semiconductor processing and liquid crystal display substrate processing. It can also be utilized in a light-sensitive printing plate for lithography making the best use of the high sensitivity.

Various investigations made by the present inventors have resulted in finding that the above problems can be solved by a negative type photoresist composition comprising a light-sensitive s-triazine compound represented by Formula (I) as a photoacid-generating agent, an acid-crosslinkable material, and an alkali soluble resin. The photoacid-generating agent, represented by Formula (I), has good compatibility with the other components contained in the composition, and is represented by the following:

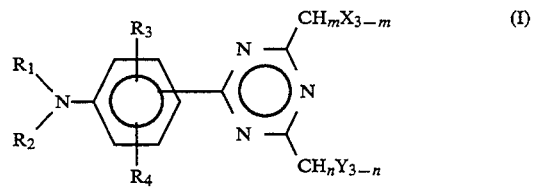

wherein $R_1$ and $R_2$, which may be the same or different, each represents a hydrogen atom, an alkyl group, a substituted alkyl group, an aryl group, a substituted aryl group, or a group represented by Formula (II) or (III); $R_1$ and $R_2$ may form a heterocyclic group consisting of non-metal atoms together with a nitrogen atom to which they are bonded; $R_3$ and $R_4$ each represents a hydrogen atom, a halogen atom, an alkyl group, or an alkoxy group; X and Y, which may be the same or different, each represents a chlorine atom or a bromine atom; and m and n each represents 0, 1 or 2;

wherein, in Formula (II), $R_5$ represents an alkyl group, a substituted alkyl group, an aryl group, or a substituted aryl group; and wherein, in Formula (III), $R_6$ and $R_7$, which may be the same or different, each represents a hydrogen atom, an alkyl group, a substituted alkyl group, an aryl group, or a substituted aryl group.

DETAILED DESCRIPTION OF THE INVENTION

The present invention will be explained below in further detail.

In Formulae (I), (II) and (III), preferably used alkyl groups, represented by $R_1$ to $R_7$, are groups having 1 to 6 carbon atoms, such as methyl, ethyl and isopropyl, and as the aryl group, the group having 6 to 14 carbon atoms, such as phenyl and naphthyl are preferred.

Suitable substituents for the substituted alkyl group and substituted aryl group represented by $R_1$, $R_2$, $R_5$, $R_6$ and $R_7$ include an aryl group such as phenyl; a halogen atom such as a chlorine atom; an alkoxy group such as methoxy and ethoxy; a carboxyl group; a carboalkoxy group such as carbomethoxy and carboethoxy; a carboaryloxy group; a cyano group; an acyl group such as acetyl and benzoyl; a nitro group; a dialkylamino group; and the sulfonyl derivatives represented by Formulae (IV) to (VI).

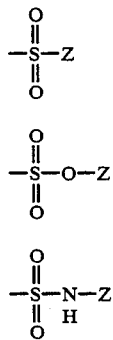

wherein, Z represents a hydrogen atom, an alkyl group, or an aryl group.

In addition to the above substituents, an alkyl group is included in the substituents for the substituted aryl group represented by $R_1$, $R_2$, $R_5$, $R_6$ and $R_7$.

Where $R_1$ and $R_2$ form a heterocyclic group consisting of non-metal atoms together with a nitrogen atom to which they are bonded, those shown below can be enumerated as the heterocyclic groups:

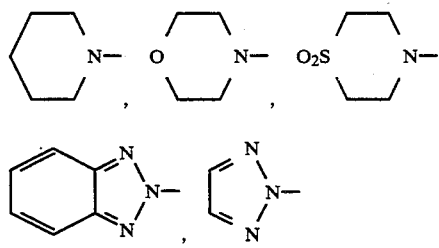

Of the substituents for the substituted alkyl group or substituted aryl group represented by $R_1$ and $R_2$, particularly preferred is an electron attractive group such as a halogen atom, a carboxyl group, a carboalkoxy group, a cyano group, and a sulfonyl derivative. Of the substituents for the substituted alkyl group or substituted aryl group represented by $R_5$, particularly preferred is an electron-donating group such as a dialkylamino group and an alkoxy group.

Of the above compounds represented by Formula (I), particularly preferred are the compounds in which $R_1$ and $R_2$ each are a hydrogen atom, carboalkoxymethyl, chloromethyl, chloroethyl, cyanomethyl, or cyanoethyl, and at least one of $R_1$ and $R_2$ is a group other than a hydrogen atom, or $R_1$ and $R_2$ form the following group:

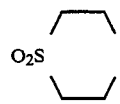

and $R_3$ and $R_4$ each is a hydrogen atom, a halogen atom, or an alkyl group.

The compound represented by Formula (I) used for the light-sensitive resin composition of the present invention can be synthesized by cyclizing an aromatic nitrile compound represented by the following formula:

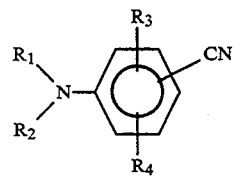

in which $R_1$ to $R_4$ are the same as those defined for $R_1$ to $R_4$ in Formula (I), with haloacetonitrile according to the method written by K. Wakabayashi et al in "*Bulletin of the Chemical Society of Japan*" vol. 42 pp. 2924 to 2930, (1960).

Examples of the compound useful as the acid generating agent used in the present invention are shown below, however, the present invention is not limited to the following compounds.

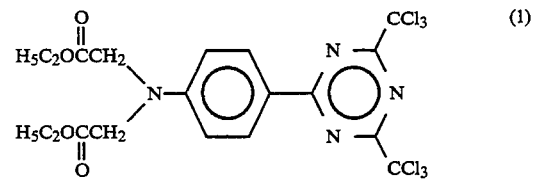

(1)

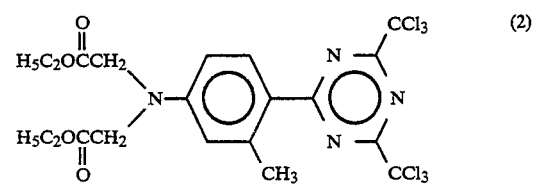

(2)

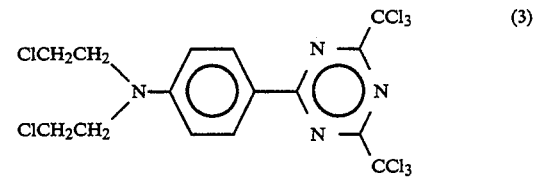

(3)

-continued
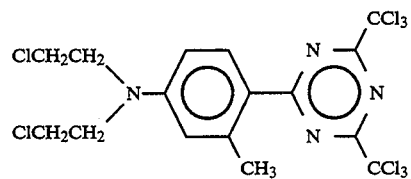 (4)
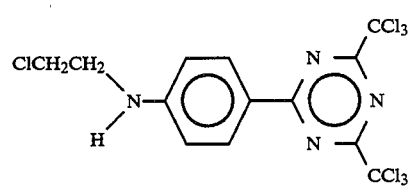 (5)
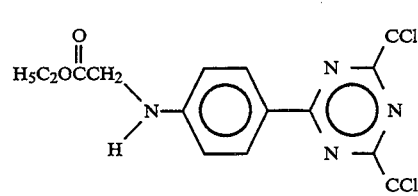 (6)
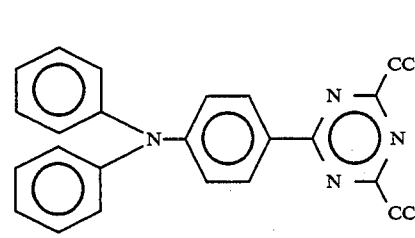 (7)
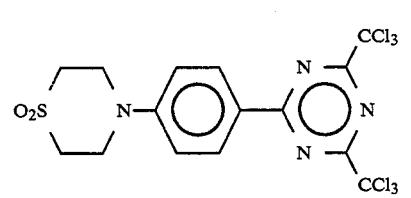 (8)
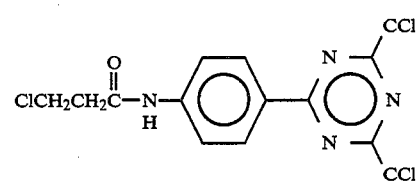 (9)
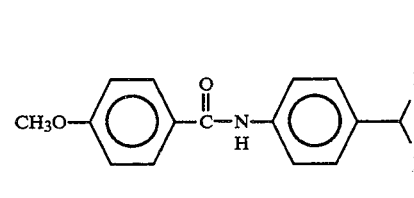 (10)
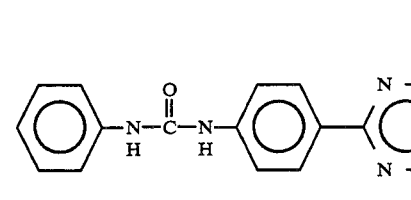 (11)
-continued
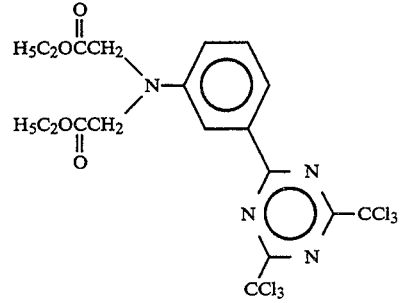 (12)
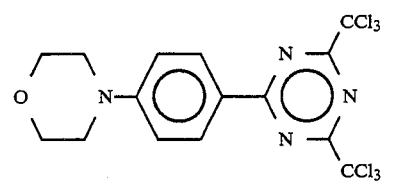 (13)
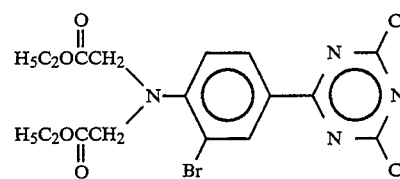 (14)
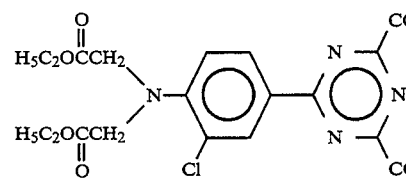 (15)
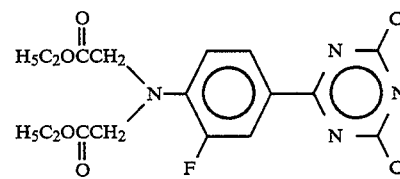 (16)
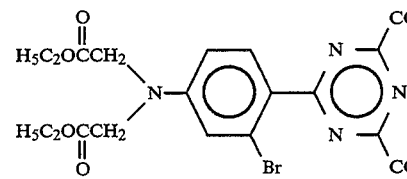 (17)
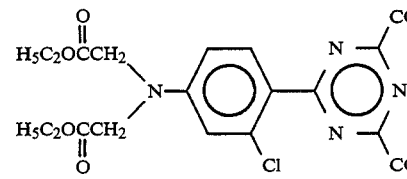 (18)
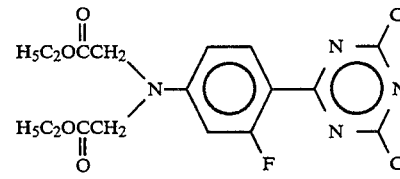 (19)

-continued
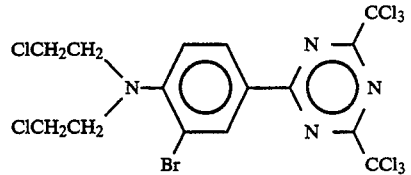 (20)
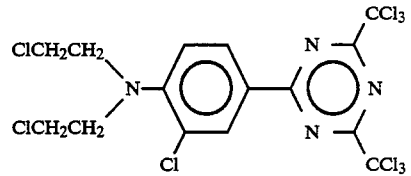 (21)
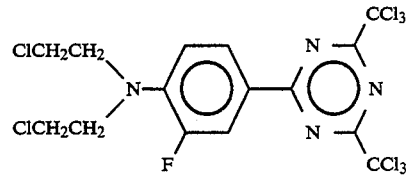 (22)
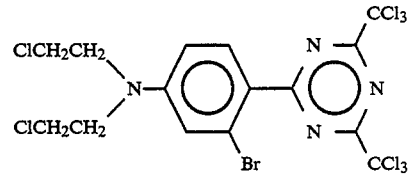 (23)
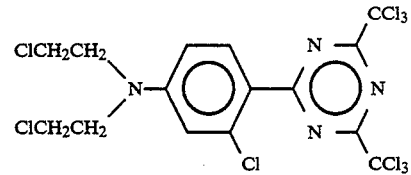 (24)
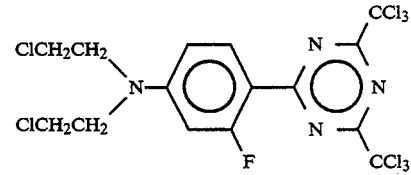 (25)
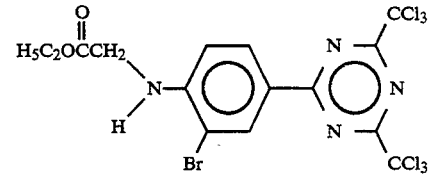 (26)
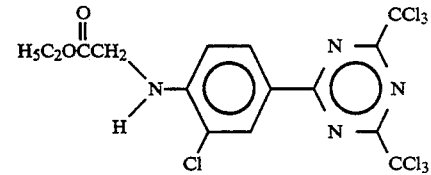 (27)
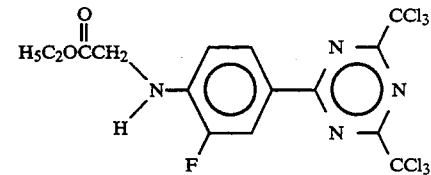 (28)
-continued
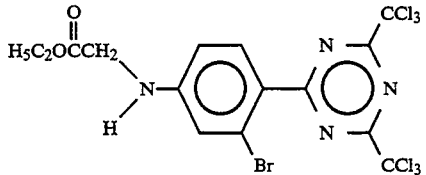 (29)
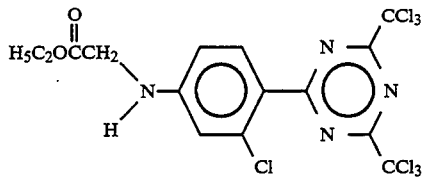 (30)
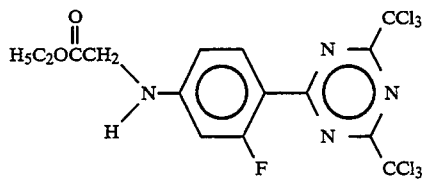 (31)
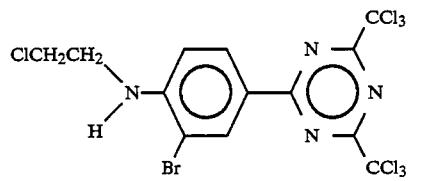 (32)
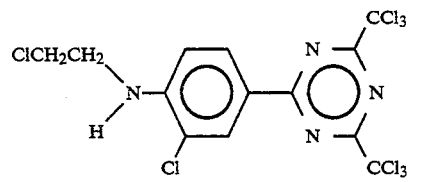 (33)
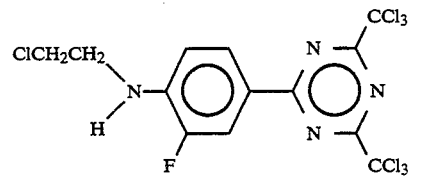 (34)
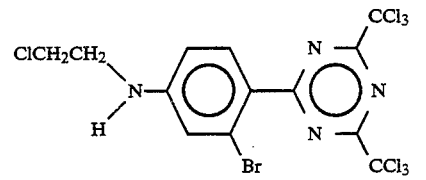 (35)
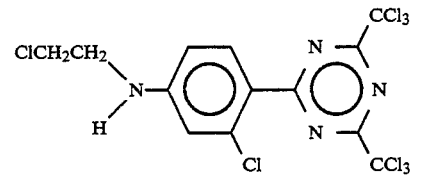 (36)
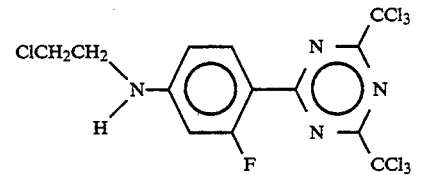 (37)

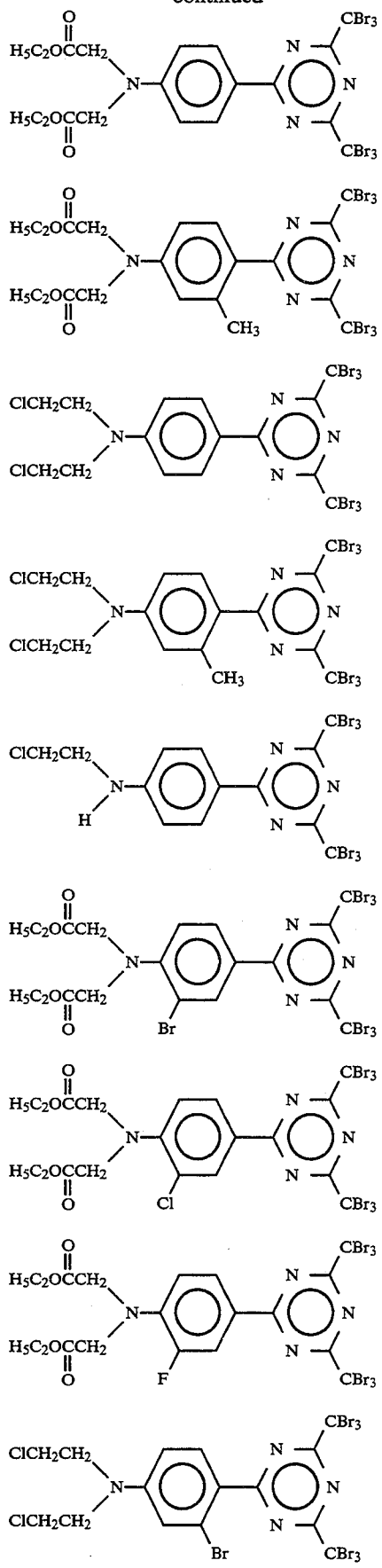

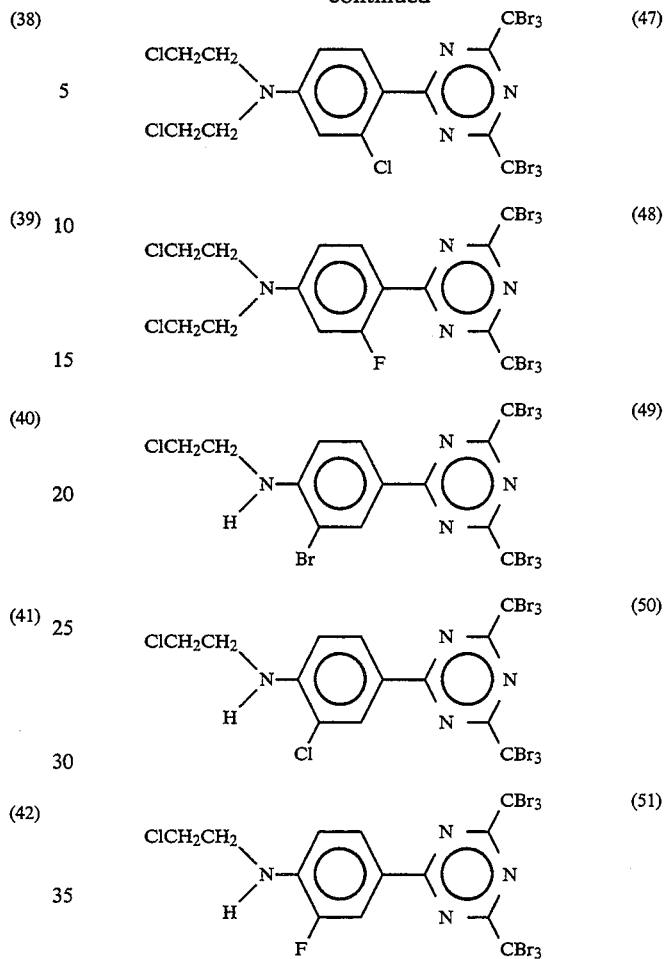

In the composition of the present invention, the above acid generating agent is used preferably in the range of 0.001 to 40 weight %, more preferably 0.05 to 20 weight %, and most preferably 0.1 to 10 weight % based on the total solid matters. It is desirable that the absorption wavelength of the acid-generating agent sufficiently overlaps the exposing wavelength, but where they do not sufficiently overlap, such can be supplemented by adding various spectral sensitizers.

Specific examples of such a method are disclosed in, for example, JP-A-3-87748, U.S. Pat. No. 410,201, and European Patent 422570A.

Contained in the acid-crosslinkable compound used in the present invention is a compound which reduces the solubility of a novolak resin in an alkali by a crosslinking or polymerization reaction in the presence of an acid catalyst or in combination with heating. One typical example of such a compound is a compound having a methylol group as an aldehyde precursor or a substituted methylol group and includes the structure represented by the following formula:

$$(R_7O-CH_2)_n-A-(CH_2-OR_8)_m$$

wherein $R_7$ and $R_8$, which may be the same or different, each represents H, a $C_1$ to $C_4$ alkyl group, a cycloalkyl group, a substituted or unsubstituted aryl group, an alkanol group, an arylalkyl group, or an acyl group; and n is in the range of 1 to 3 and m in the range of 0 to 3; A is a group represented by B or B—Z—B; wherein, B represents a substituted or unsubstituted, mononuclear or condensed polynuclear aromatic hydrocarbon or a heterocyclic compound containing oxygen, sulfur and nitrogen, and Z represents a single bond, a $C_1$ to $C_4$ alkylene group, a substituted alkylene group, an arylene group, a substituted arylene group, an arylalkylene group, —O—, —S—, —$SO_2$, —CO—, —COO—, —O-COO—, —CONH—, a substituted or unsubstituted alkylene group or; a polymer such as a phenol resin.

Specific examples of such a compound include various aminoblasts or phenoblasts, that is, a ureaformaldehyde resin, a melamine-formaldehyde resin, a benzoguanamine-formaldehyde resin, a glycol laurylformaldehyde resin, and the monomers or oligomers thereof. These are commercially available from manufacturers. As a typical example thereof, Cymel (the registered brand name) 300, 301, 303, 350, 370, 380, 1116, 1130, 1123, 1125, and 1170 each manufactured by American Cyanamid Co., Ltd., and Nikalac (the registered brand name) Mw 30, Mw 30M, Mw 30HM, Mx 45, and Bx 4000 each manufactured by Sanwa Chemical Co., Ltd. They may be used alone or in combination of two or more.

Further examples include the methylolated or alkoxymethylated phenol derivatives to be used as a formaldehyde precursor. They may be used as a monomer or in the form of a resin such as a resol resin and a benzyl ether resin.

A compound having a silanol group may be used as the acid-crossliakable material such as, for example, the compounds disclosed in European Patent 361907 and JP-A-2-173647.

In the composition of the present invention, these acid-crossliakable materials are used preferably in the proportion of 0.1 to 60 weight %, more preferably 0.5 to 40 weight %, and most preferably 1 to 30 weight % based on the total solid matters.

Examples of the alkali soluble resin, which can be used in the present invention, include a novolak resin, an acetone-pyrogallol resin, polyhydroxystyrene, a styrene-maleic acid anhydride copolymer, a carboxyl group-containing methacrylate series resin, and the derivative thereof, but the present invention is not limited thereto.

The particularly preferred alkali soluble resin is a novolak resin. The novolak resin can be prepared by subjecting a monomer, as the main component, to an addition condensation with aldehydes in the presence of an acid catalyst.

There can be used alone, or in combination of two or more, the following monomers: phenol; cresols such as phenol, m-cresol, p-cresol, and o-cresol; xylenols such as 2,5-xylenol, 3,5-xylenol, 3,4-xylenol, and 2,3-xylenol, alkylphenols such as m-ethylphenol, p-ethylphenol, o-ethylphenol, p-t-butylphenol, and 2,3,5-trimethylphenol; alkoxyphenols such as p-methoxyphenol, m-methoxyphenol, 3,5-dimethoxyphenol, 2-methoxy-4-methylphenol, m-ethoxyphenol, p-ethoxyphenol, m-propoxyphenol, p-propoxyphenol, m-butoxyphenol, and p-butoxyphenol; bisalkylphenols such as 2-methyl-4-isopropylphenol; and hydroxy aromatic compounds such as m-chlorophenol, p-chlorophenol, o-chlorophenol, dihydroxybiphenyl, hisphenol A, phenylphenol, resorcinol, and naphthol, but the present invention is not limited thereto.

There can be used as aldehydes, for example, formaldehyde, paraformaldehyde, acetaldehyde, propylaidehyde, benzaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, furrural, chloracetaldehyde, and the acetal compounds thereof, for example, ohioracetaldehyde diethylacetal. Of them, formaldehyde is preferably used.

These aldehydes may be used alone or in combination of two or more. There can be used as the acid catalyst, hydrochloric acid, sulfuric acid, formic acid, acetic acid, and oxalic acid.

The weight average molecular weight of the novolak resin thus obtained is preferably in the range of 1,000 to 30,000. Particularly preferred is the range of 2,000 to 20,000.

The weight average molecular weight is defined by the polystyrene-converted value in a gel permeation chromatography.

In the composition of the present invention, these alkali soluble resins are allowed to be present in a concentration necessary for film formation. They are used preferably in the range of 40 weight % or more, more preferably 60 to 99 weight %, most preferably 70 to 99 weight % based on the total solid matters.

A low molecular weight aromatic compound can be incorporated into the composition of the present invention for improving, for example, the promotion of the dissolution in a developing solution, the adjustment of a sensitivity, etc. There can be applied, as such, a low molecular weight aromatic polyhydroxy compound, and compounds known as a dissolution promoting additive for a positive type photoresist comprising a naphthoquinonediazide-novolak resin. However, in the usual range of a dissolution promoting effect, a sensitization effect and layer reduction take place at the same time and, therefore, the optimum alkali solubilities of the polyhydroxy compounds are combined according to the photoresist composition in order to select the compound having the least amount of such problems.

Further, a dye, pigment, plasticizer, an adhesire, surface active agent, and photosensitizer can be incorporated into the light-sensitive composition of the present invention. Specific examples thereof include a dye such as Methyl Violet, Crystal Violet, and Malachite Green, a plasticizer such as stearic acid, an acetal resin, a phenoxy resin, an alkyd resin, and an epoxy resin, an adhesive such as, hexamethyldisilazane, chloromethylsilane, an organic phosphoric acid compound, and ureas, and a surface active agent such as nonylphenoxypoly(ethyleneoxy)ethanol, and octylphenoxypoly(ethyleneoxy)ethanol.

In the dye, a particularly advantageous dye contains an alkali soluble group such as an aromatic hydroxy group and a carboxylic acid group in the molecule, for example, curcumin. An oil soluble dye and a base dye are available as a preferred dye. Specifically, dyes such as Oil Yellow #101, Oil Yellow #103, Oil Pink #312, Oil Green BG, Oil Blue BOS, Oil Blue #603, Oil Black BY, Oil Black BS, Oil Black T-505 (each manufactured by Orient Chemical Ind. Co., Ltd.), Crystal Violet (CI 42555 ), Methyl Violet (CI 42535 ), Rhodamine B (CI 45170B), Malachite Green (CI 42000), and Methylene Blue (CI 52015) can be used in the present invention.

Further, the following spectral sensitizers can be added and the light-sensitive composition of the present invention can be sensitized to a longer wavelength region than the far UV region (wherein the photoacid generating agent has no absorption), to thereby provide a light-sensitive composition of the present invention with a sensitivity to i-line or g-line.

Specifically, the preferred spectral sensitizers are benzophenone, p,p'-tetraethylmethyldiaminobenzophenone, p,p'-tetraethylethylaminobenzophenone, 2-chlorothioxanthone, anthrone, 9-ethoxyanthracene, anthracene, pyrene, perylene, phenothiazine, benzil, acridine orange, benzoflavin, Setoflavin-T, 9,10-diphenylanthracene, 9-fluorenone, acetophenone, phenanthrene, 2-nitrofluorene, 5-nitroacenaphthene, benzoquinone, 2-chloro-4-nitroaniline, N-acetyl-p-nitroaniline, p-nitroaniline, N-acetyl-4-nitro-1-naphthylamine, picramide, anthraquinone, 2-ethyl-anthraquinone, 2-tert-butylanthraquinone, 2-benzanthraquinone, 3-methyl-1,3-diaza-1,9-benzanthrone, dibenzalacetone, 1,2-naphthoquinone, 3,3'-carbonyl-bis( 5,7-dimethoxycarbonyl-coumarin), and coronene, but the present invention is not limited thereto.

The light-sensitive composition of the present invention is dissolved in a solvent (which dissolves the above respective components) and coated on a support. Preferred solvents include ethylene dichloride, cyclohexanone, cyclopentanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, toluene, ethyl acetate, methyl lactate, ethyl lactate, N,N-dimethylformamide, dimethylsulfoxide, and tetrahydrofuran. These solvents are used alone or in a mixture.

A surface active agent can be added as well to the above solvents. Specifically, examples which can be used include nonionic type surface active agents including polyoxyethylene alkyl ethers such as polyoxyethylene lauryl ether, polyoxyethylene stearyl ether, polyoxyethylene cetyl ether, and polyoxyethylene oleyl ether; polyoxyethylene alkylaryl ethers such as polyoxyethylene octylphenol ether and polyoxyethylene nonylphenol ether; polyoxyethylene/polyoxypropylene block copolymers; sorbitan fatty acid esters such as sorbitan monolaurate, sorbitan monopalmitate, sorbitan monostearate, sorbitan monooleate, sorbitan trioleate, and sorbitan tristearate; polyoxyethylene sorbitan fatty acid esters such as polyoxyethylene sorbi tan monolaurate, polyoxyethylene sorbitan monopalmitate, polyoxyethylene sorbitan monostearate, polyoxyethylene sorbitan trioleate, and polyoxyethylene sorbitan tristearate; fluorine series surface active agents such as Eftop EF 301, EF 303 and EF 352 (manufactured by Shin Akita Kasei Co., Ltd.), Megafac F 171 and F 173 (manufactured by Dainippon Ink Chemical Co., Ltd.), Fluorade FC 430 and FC 431 (manufac-tured by Sumitomo Three M Co., Ltd.), Asahi Guard AG 710, and Surfton S-382, SC 101, SC 102, SC 103, SC!04, SC 105, and SC 106 (manufactured by Asahi Glass Co., Ltd.); surface active agents having a siliconcontaining group, such as KP 341 ( Shin-etsu Chemical Ind. Co., Ltd.); and an acrylic acid series or methacrylic acid series ( co )polymer Polyflow No. 75 and No. 95 (manufactured by Kyoeisha Oil & Fat Chemical Co., Ltd.).

The addition amount of these surface active agents is usually two parts by weight or less, preferably 1 part by weight or less, per 100 parts by weight of the solid matter contained in the composition of the present invention.

These surface active agents may be added alone or can be added in combination.

The above light-sensitive composition is coated on a substrate used for manufacturing a precision integrated circuit element (for example, a silicon substrate which is coated with silicon dioxide) and a substrate used for manufacturing a liquid crystal display (for example, a glass substrate which is coated with silicon nitride) by a suitable coating method such as a spinner and a coater, and then is subjected to exposure through a prescribed mask and then to be developed, whereby a superior resist can be obtained. It is preferred in many cases that a heating process (PEB) is carried out at 80° to 130° C. after the exposure, and then the development is carried out for the purpose of raising sensitivity.

Where the light-sensitive composition is used for lithography, the composition can be coated on a support prepared by subjecting an aluminum plate toughened by means of an electrolytic graining and a mechanical abrasion to an anode oxidation in the thickness of approximately 1 to 2 μm.

As the developing solution for the light-sensitive composition of the present invention, examples include the aqueous solutions of alkalis including inorganic alkalis such as sodium hydroxide, potassium hydroxide, sodium carbonate, sodium silicate, sodium metaslicate, and aqueous ammonia; primary amines such as ethylamine and n-propylamine; secondary amines such as diethylamine and di-n-butylamine; tertiary amines such as triethylamine and methyl diethylamine; alkanolamines such as dimethylethanolamine and triethanolamine; quaternary ammonium salts such as tetramethylammonium hydroxide and tetraethylammonium hydroxide; and cyclic amines such as pyrrole and piperidine.

Further, alcohol and a surface active agent can also be added to the aqueous solutions of the above alkalis in a suitable amount.

The present invention will be explained below in further detail but the content of the present invention is not limited thereby.

Unless otherwise indicated, all parts, percents, ratios and the like are by weight.

EXAMPLES

Examples 1 to 15 and Comparative Examples 1 and 2

5 g of a cresol novolak resin (m/p=6/4; Mw=4500), 0.5 g of Nikalac Mw 30 (the registered brand name: manufactured by Sanwa Chemical Co., Ltd.) containing the main component of methylolated melamine as an acid crosslinking agent, and 0.1 g of the compound shown in Table 1 as a photoacid generating agent were dissolved in 16.5 g of ethyl cellosolve acetate. This solution was filtrated with a microfilter of 0.2 μm to thereby prepare a photoresist composition. This photoresist composition was coated on a clean silicon wafer with a spinner and dried on a hot plate at 90° C. for 60 seconds to thereby obtain a resist film with the film thickness of 1 μm. This resist film was exposed by a contraction projector ( i-line, an aperture number 0.40) via a resolution chart mask while changing the exposure in stages, and then it was heated on the hot plate at 100° C. for 120 seconds, followed by developing it in a tetramethylammonium hydroxide (TMAH) 2.38% aqueous solution for 60 seconds and drying it after washing for 30 seconds.

The sensitivity was shown by exposure with which the residual film yield of the resist at an irradiated portion after development became 50%.

The resolution was evaluated by observing the fine pattern of the resist on the wafer obtained with the above exposure with a scanning type electron microscope (SEM) to determine the smallest distance between the patterns which were separated down to the substrate face.

Also, the development residue, present between the patterns, was observed with the electron microscope for visual evaluation.

The results are summarized in Table 1.

The structures of the photoacid generating agents used in Comparative Examples 1 and 2 are shown below.

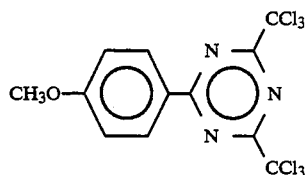
(A)

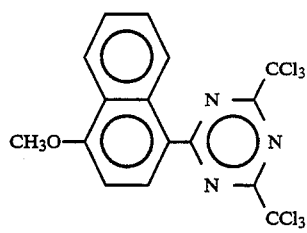
(B)

As apparent from the results shown in Table 1, it can be seen that the compositions according to the present invention have high sensitivity and resolution and a small development residue.

TABLE 1

Composition of Resist and Evaluation Results (1)

| | Photoacid generator | Exposure (mJ/cm$^2$) | Resolution (μm) | Development residue |
|---|---|---|---|---|
| Example 1 | 1 | 50 | 0.5 | None |
| Example 2 | 2 | 90 | 0.5 | None |
| Example 3 | 3 | 50 | 0.55 | None |
| Example 4 | 6 | 90 | 0.5 | None |
| Example 5 | 5 | 120 | 0.5 | None |
| Example 6 | 6 | 120 | 0.6 | None |
| Example 7 | 7 | 150 | 0.5 | None |
| Example 8 | 9 | 120 | 0.5 | None |
| Example 9 | 10 | 70 | 0.5 | None |
| Example 10 | 14 | 30 | 0.5 | None |
| Example 11 | 15 | 30 | 0.5 | None |
| Example 12 | 17 | 30 | 0.5 | None |
| Example 13 | 20 | 30 | 0.5 | None |
| Example 14 | 21 | 30 | 0.5 | None |
| Example 15 | 38 | 100 | 0.5 | None |
| Comparative Example 1 | A | 120 | 0.6 | Present |
| Comparative Example 2 | B | 150 | 0.6 | Present |

EXAMPLES 16 TO 22

The experiments were carried out in the same manner as those in Examples 1 to 15 except that exposure was carried out with a contraction projector (g-line, an aperture number 0.48) and the kind and amount of the sensitizer and the kind photoacid generating agent were varied as shown in Table 2. The results are shown in Table 2. It can be seen from the results summarized in Table 2 that the compositions according to the present invention have a high resolution and sensitivity in any combination of photoacid generating agents.

TABLE 2

Composition of Resist and Evaluation Results (2)

| | Photoacid generator | Sensitizer (weight %*) | Exposure (mJ/cm$^2$) | Resolution (μm) |
|---|---|---|---|---|
| Example 16 | 1 | Pyrene (1%) | 50 | 0.5 |
| Example 17 | 2 | Tetramethyldiamino benzophenone (2%) | 90 | 0.5 |
| Example 18 | 7 | Anthracene (1%) | 60 | 0.55 |
| Example 19 | 17 | Perylene (1%) | 50 | 0.5 |
| Example 20 | 18 | Phenothiazine (1%) | 60 | 0.5 |
| Example 21 | 20 | p-Fluorenone (1%) | 70 | 0.5 |
| Example 22 | 24 | Anthraquinone (1%) | 80 | 0.55 |

*Addition amount based on the total solid matters.

The chemically sensitized negative type light-sensitive photoresist composition of the present invention has a high sensitivity and a high resolution and scarcely generates residue upon development. This light-sensitive resin composition is suitable for use as a photoresist for semiconductor processing and a light-sensitive printing plate for lithography.

While the invention has been described in detail and with reference to specific embodiments thereof, it will be apparent to one skilled in the art that various changes and modifications can be made therein without departing from the spirit and scope thereof.

What is claimed is:

1. A negative type photoresist composition consisting essentially of a light-sensitive s-triazine compound, an acid-crosslinkable material, and an alkali soluble resin; wherein said light-sensitive s-triazine compound is represented by the following formula (I):

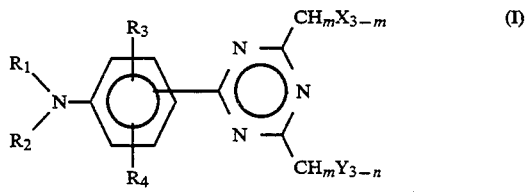
(I)

wherein R$_1$ and R$_2$, which may be the same or different, each represents a hydrogen atom, an alkyl group, a substituted alkyl group, an aryl group, a substituted aryl group, a group represented by formula (II) or (III), or R$_1$ and R$_2$ may form a heterocyclic group consisting of non-metal atoms bonded to a nitrogen atom; R$_3$ and R$_4$ each represents a hydrogen atom, a halogen atom, an alkyl group, or an alkoxy group; X and Y, which may be the same or different, each represents a chlorine atom or a bromine atom; and m and n each represents 0, 1 or 2;

(II)

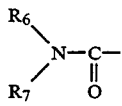

(III)

wherein $R_5$ represents an alkyl group, a substituted alkyl group, an aryl group, or a substituted aryl group; and $R_6$ and $R_7$, which may be the same or different, each represents a hydrogen atom, an alkyl group, a substituted alkyl group, an aryl group, or a substituted aryl group; and wherein said acid-crosslinkable material is represented by the following formula:

wherein $R_7$ and $R_8$, which may be the same or different, each represents a hydrogen atom, a $C_1$ to $C_4$ alkyl group, a cycloalkyl group, a substituted or unsubstituted aryl group, an alkanol group, an arylalkyl group, or an acyl group; n is an integer of 1 to 3, and m is an integer of 0 to 3; A is a group represented by B or B—Z—B, wherein B represents a substituted or unsubstituted mononuclear or condensed polynuclear aromatic hydrocarbon or a heterocyclic compound containing oxygen, sulfur and nitrogen, and Z represents a single bond, a $C_1$ to $C_4$ alkylene group, a substituted alkylene group, an arylene group, a substituted arylene group, an arylalkylene group, —O—, —S—, —SO$_2$—, —CO—, —COO—, —OCOO—, —CONH—, a substituted or unsubstituted alkylene group or a polymer such as a phenol resin.

2. A negative type photoresist composition as in claim 1, wherein $R_1$ and $R_2$ each is selected from the group consisting of a hydrogen atom, carboalkoxymethyl, chloromethyl, chloroethyl, cyanomethyl, or cyanoethyl, with the proviso that $R_1$ and $R_2$ are not each a hydrogen.

3. A negative type photoresist composition as in claim 1, wherein $R_1$ an $R_2$ form the following heterocyclic group:

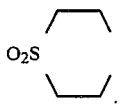

4. A negative type photoresist composition as in claim 1, wherein said alkali soluble resin is a novolak resin.

* * * * *